United States Patent
Braganca et al.

(10) Patent No.: US 9,030,783 B1
(45) Date of Patent: May 12, 2015

(54) PHASE DETECTION OF SPIN TORQUE OSCILLATOR READER EXCITED THROUGH PARAMETRIC EXCITATION

(71) Applicant: HGST Netherlands B.V., Amsterdam (NL)

(72) Inventors: Patrick M. Braganca, San Jose, CA (US); Samir Y. Garzon, Sunnyvale, CA (US); Bruce A. Gurney, San Jose, CA (US); Keyu Pi, San Jose, CA (US); Rehan A. Zakai, San Ramon, CA (US); Jian Zhu, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/174,084

(22) Filed: Feb. 6, 2014

(51) Int. Cl.
G11B 5/39 (2006.01)
G11B 21/02 (2006.01)

(52) U.S. Cl.
CPC ................... G11B 5/3906 (2013.01)

(58) Field of Classification Search
USPC .......... 360/125.3, 30, 46, 324, 324.1, 324.11, 360/324.12, 324.2
See application file for complete search history.

(56) References Cited

U.S. PATENT DOCUMENTS

| | | | |
|---|---|---|---|
| 6,498,692 B1 | 12/2002 | Hassner et al. | |
| 7,602,588 B2 * | 10/2009 | Sato et al. | 360/324 |
| 7,633,699 B2 * | 12/2009 | Kaka et al. | 360/67 |
| 7,635,903 B2 * | 12/2009 | Mancoff et al. | 257/422 |
| 7,678,475 B2 * | 3/2010 | Slavin et al. | 428/811 |
| 7,940,485 B2 * | 5/2011 | Kudo et al. | 360/55 |
| 7,982,986 B2 | 7/2011 | Sato et al. | |
| 8,049,567 B2 | 11/2011 | Persson et al. | |
| 8,174,798 B2 * | 5/2012 | Nagasawa et al. | 360/313 |
| 8,194,361 B2 * | 6/2012 | Kudo et al. | 360/324.11 |
| 8,259,409 B2 | 9/2012 | Braganca et al. | |
| 8,320,080 B1 | 11/2012 | Braganca et al. | |
| 8,379,352 B1 | 2/2013 | Braganca et al. | |
| 8,570,677 B2 * | 10/2013 | Braganca et al. | 360/30 |
| 8,598,957 B2 * | 12/2013 | Lee et al. | 331/46 |
| 8,610,512 B2 * | 12/2013 | Michel et al. | 331/96 |
| 8,630,070 B2 * | 1/2014 | Sato et al. | 360/324 |
| 2009/0066428 A1 * | 3/2009 | Badets | 331/49 |
| 2009/0086354 A1 * | 4/2009 | Sato et al. | 360/30 |
| 2009/0201614 A1 * | 8/2009 | Kudo et al. | 360/324.11 |
| 2010/0142088 A1 * | 6/2010 | Iwasaki et al. | 360/110 |
| 2011/0205667 A1 * | 8/2011 | Yamada et al. | 360/122 |
| 2014/0057585 A1 * | 2/2014 | Kakinuma et al. | 455/323 |

OTHER PUBLICATIONS

K. Mizushima et al.; "Signal-to-Noise Ratios in High-Signal-Transfer-Rate Read Heads Composed of Spin-Torque Oscillators"; Journal of Applied Physics 107, 063904; Mar. 2010.

* cited by examiner

*Primary Examiner* — Brian Miller
(74) *Attorney, Agent, or Firm* — Patterson & Sheridan, LLP

(57) ABSTRACT

The embodiments disclosed generally relate to a read device in a magnetic recording head. The read device uses parametric excitation to injection lock the STO to an external AC signal with a frequency that is two times the resonance frequency, or more. The field from the media acting on the STO causes a change in the phase between the STO output and the external locking signal, which can be monitored using a phase detection circuit. The injection locking improves the STO signal to noise ratio and simplifies the detection circuit.

22 Claims, 4 Drawing Sheets

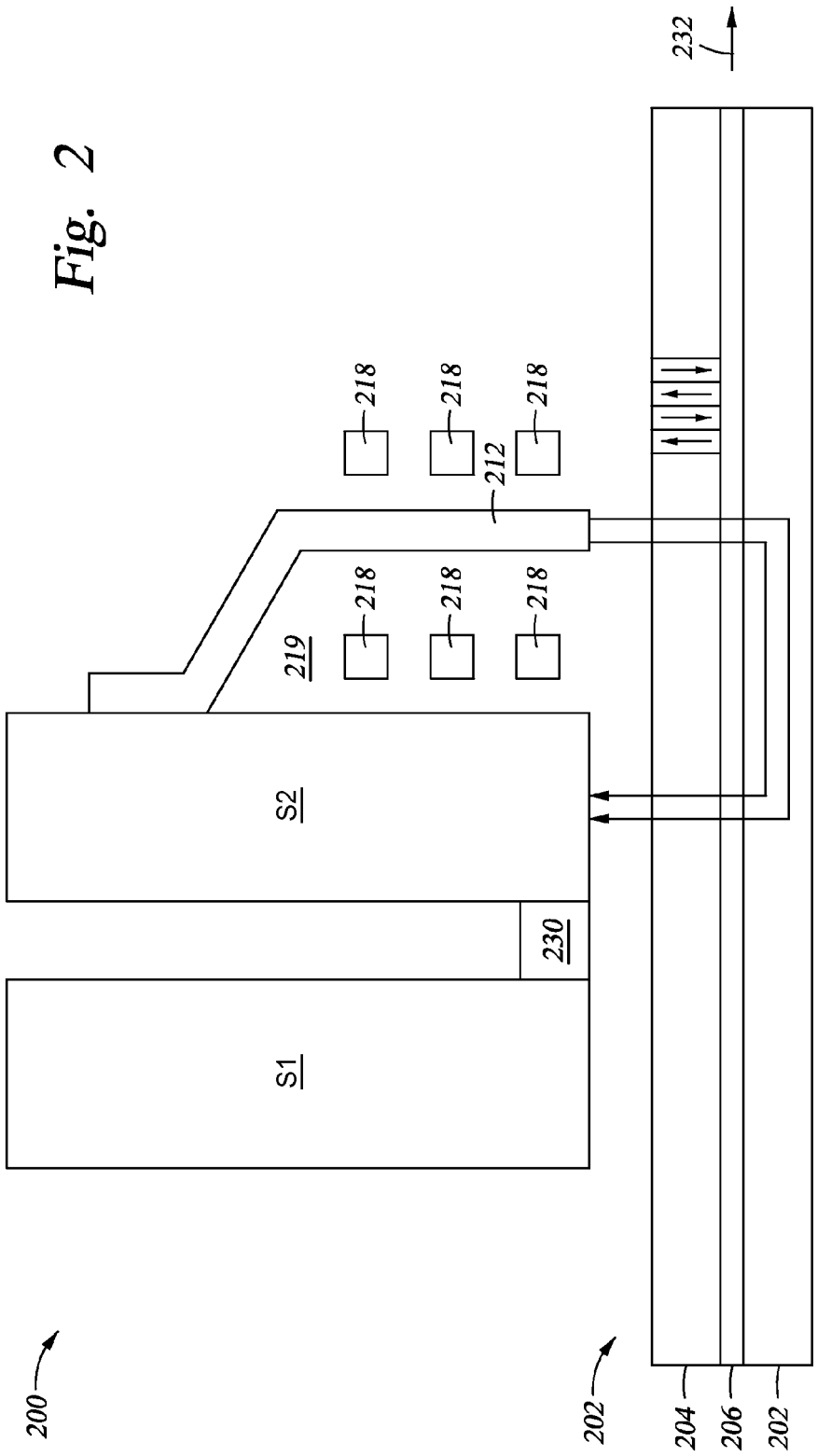

PHASE DETECTION OF SPIN TORQUE OSCILLATOR READER EXCITED THROUGH PARAMETRIC EXCITATION

BACKGROUND OF THE INVENTION

1. Field of the Invention

Embodiments disclosed herein generally relate to a magnetic read head for use in a hard disk drive.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing magnetic transitions corresponding to host data. The read and write heads are connected to a signal processing circuitry that operates according to a computer program to implement the writing and reading functions.

As areal densities increase, the dimensions of both bits and the read back sensor must become smaller and smaller. For readers designed with a spin valve structure, such as all GMR, TMR and CPP-GMR readers, the increasingly smaller free layer will show more thermal fluxuations resulting in greater noise in the device. The greater noise will reduce SNR to below acceptable limits for magnetic recording above 1-2 Tb/in2. Spin Torque Oscillators (STO) are being investigated which may be less sensitive to thermal fluxuations. Instead of detecting bits by the resistance change resulting from rotation of the free layer in response to the media field, this new device uses the change in frequency of spin torque induced precession of the magnetizations of a magnetic layer that is caused by changes in the field from the disk.

Therefore, there is a need in the art for an improved read head.

SUMMARY OF THE INVENTION

The embodiments disclosed herein generally relate to a read head in a magnetic recording head. The read head uses parametric excitation to injection lock the STO to an external AC signal with a frequency that is two times the resonance frequency, or more. The field from the media acting on the STO causes a change in the phase between the STO output and the external locking signal, which can be monitored using a phase detection circuit. The injection locking improves the STO signal and readback SNR and simplifies the detection circuit.

In one embodiment, a magnetic read head comprises a spin torque oscillator; and a circuit coupled to the spin torque oscillator. The circuit comprises a local oscillator; a first power divider coupled to the local oscillator; a first amplifier coupled to the power divider; a time delay coupled to the first amplifier; a first mixer coupled to the time delay; a second power divider coupled to the first power divider; a second mixer coupled to the second power divider; a first band pass filter coupled to the second mixer; a second band pass filter coupled to the first band pass filter; and a second amplifier coupled to the second band pass filter and the mixer.

In another embodiment, a magnetic read head comprises a spin torque oscillator; and a circuit coupled to the spin torque oscillator. The circuit comprises a local oscillator; a power divider coupled to the local oscillator; a frequency divider coupled to power divider; a first amplifier coupled to the frequency divider; a time delay coupled to the first amplifier; a mixer coupled to the time delay; a first band pass filter coupled to the power divider; a second band pass filter coupled to the first band pass filter; and a second amplifier coupled to the second band pass filter and the mixer.

BRIEF DESCRIPTION OF THE DRAWINGS

So that the manner in which the above recited features can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a side view of a read/write head and magnetic disk of the disk drive of FIG. 1, according to one embodiment of the invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The embodiments disclosed herein generally relate to a read head in a magnetic recording head. The read head uses parametric excitation to injection lock the STO to an external AC signal with a frequency that is two times the resonance frequency, or more. The field from the media acting on the STO causes a change in the phase between the STO output and the external locking signal, which can be monitored using a phase detection circuit. The injection locking improves the STO signal and readback SNR and simplifies the detection circuit.

Figure 1:
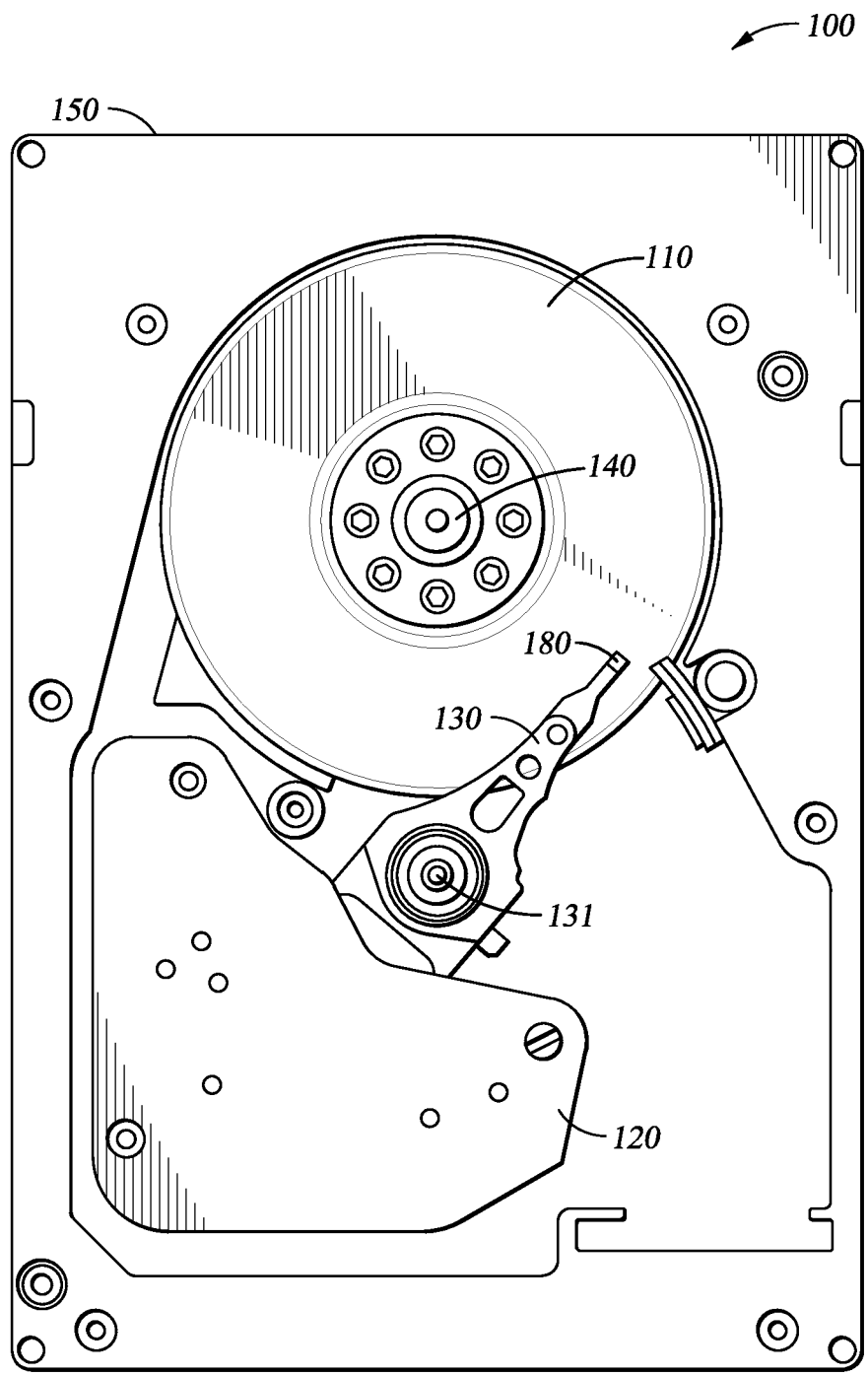
FIG. 1 illustrates an exemplary magnetic disk drive, according to an embodiment of the invention.

FIG. 1 illustrates a top view of an exemplary hard disk drive (HDD) 100, according to an embodiment of the invention. As illustrated, HDD 100 may include one or more magnetic disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks 110 may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

FIG. 2 is a fragmented, cross-sectional side view through the center of a read/write head 200 facing magnetic disk 202. The read/write head 200 and magnetic disk 202 may correspond to the magnetic head 180 and magnetic disk 110, respectively in FIG. 1. In some embodiments, the magnetic disk 202 may be a "dual-layer" medium that includes a perpendicular magnetic data recording layer (RL) 204 on a "soft" or relatively low-coercivity magnetically permeable underlayer (PL) 206. The read/write head 200 includes an ABS, a magnetic write head and a magnetic read head, and is mounted such that its ABS is facing the magnetic disk 202. In FIG. 2, the disk 202 moves past the head 200 in the direction indicated by the arrow 232. The RL 204 is illustrated with perpendicularly recorded or magnetized regions, with adjacent regions having magnetization directions, as represented by the arrows located in the RL 204. The magnetic fields of the adjacent magnetized regions are detectable by the sensing element 230, such as an STO sensor, as the recorded bits. The write head includes a magnetic circuit made up of a main pole 212 and a thin film coil 218 shown in the section embedded in non-magnetic material 219.

Figure 3A:
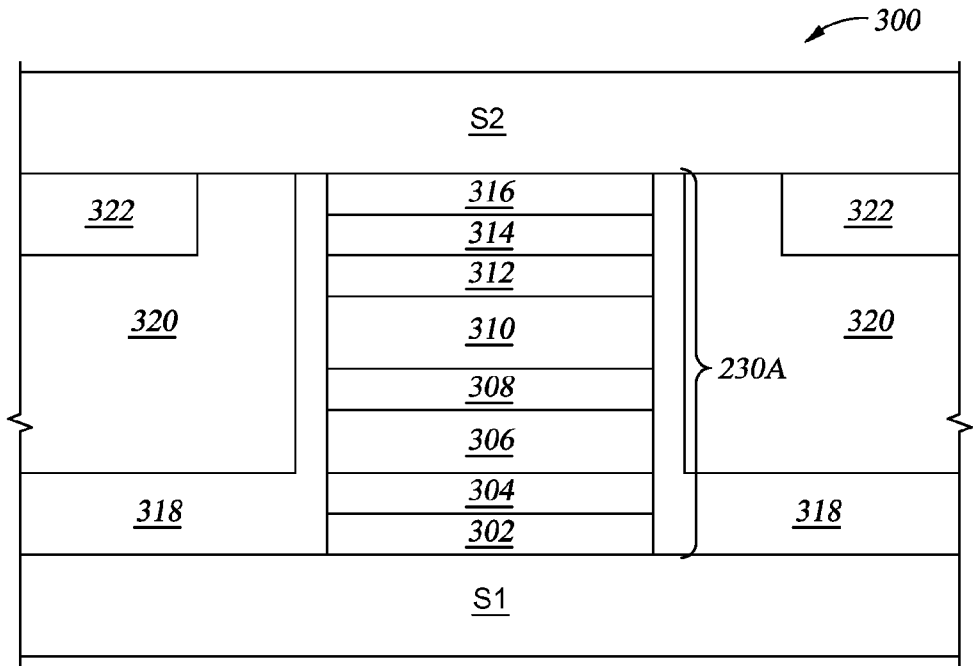
FIGS. 3A-3B are schematic cross-sectional views of portions of a read head of FIG. 2 according to embodiments of the invention.
Figure 3B:
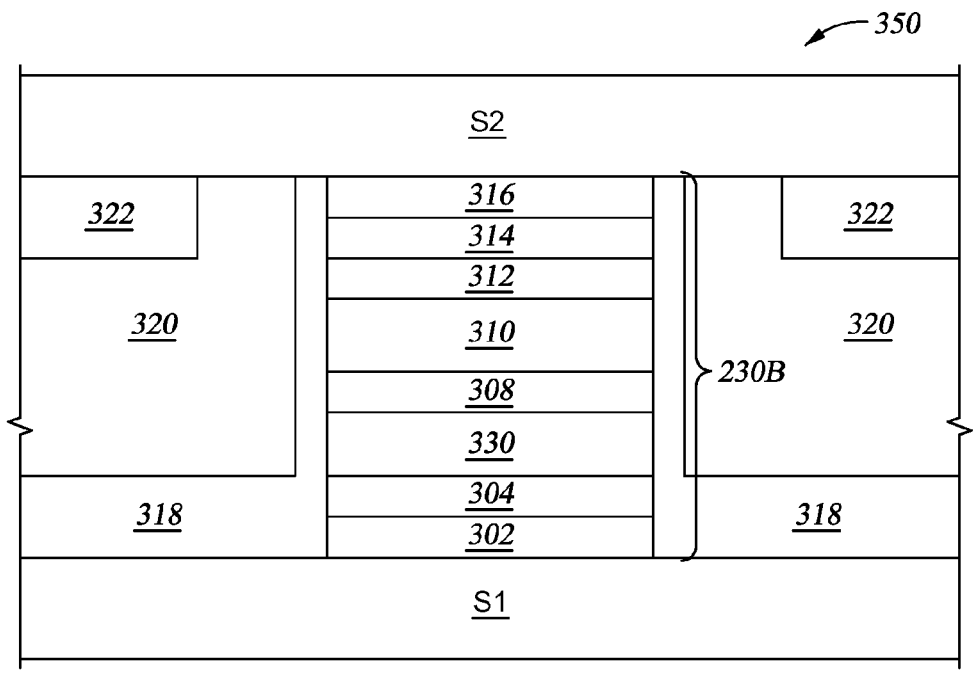

FIGS. 3A-3B are schematic cross-sectional views of portions of a read head of FIG. 2 according to embodiments of the invention. FIG. 3A is a CPP-TMR read head 300 having a STO sensor 230A disposed between shields S1, S2. The read head 300 includes an underlayer 302 disposed on the bottom shield S1. The underlayer 302 may comprise nonmagnetic materials such as Hf, Ru, Ta, soft magnetic materials such as Ni or Ni containing alloys such as NiFe, or combinations thereof and be deposited by sputtering to a thickness of between about 15 Angstroms and about 75 Angstroms. An antiferromagnetic layer 304 is deposited on the underlayer 302. The antiferromagnetic layer 304 comprises PtMn, IrMn, or PtPdMn and has a thickness of between about 40 Angstroms and about 70 Angstroms.

A pinned magnetic layer 306 is deposited on the antiferromagnetic layer 304. The pinned magnetic layer 306 may comprise Ni, Co, Fe, or their alloys such as NiFe, CoFe or CoFeB and be deposited by sputtering to a thickness of between about 10 Angstroms and about 50 Angstroms. A nonmagnetic coupling layer 308 is deposited on the pinned magnetic layer 306. The nonmagnetic coupling layer 308 may comprise Hf, Ru or Ta and be deposited to a thickness of between about 5 Angstroms and about 15 Angstroms. A reference magnetic layer 310 is deposited on the nonmagnetic coupling layer 308. The reference magnetic layer 310 may comprise Ni, Co, Fe, or their alloys such as NiFe, CoFe or CoFeB and be deposited by sputtering to a thickness of between about 10 Angstroms and about 50 Angstroms. In some instances, it may be preferable to eliminate the nonmagnetic coupling layer 308 and reference magnetic layer 310 and use a single pinned magnetic layer 306.

A spacer layer 312 is deposited on the reference magnetic layer 310. In a TMR sensor, the spacer layer 312 is an oxide barrier layer. In one embodiment, the spacer layer 312 is an oxide barrier layer and comprises MgO, $HfO_2$, TiO2 or $Al_2O_3$. A free magnetic layer 314 is deposited on the spacer layer 312. The free magnetic layer 312 comprises Ni, Co, Fe, or their alloys such as NiFe, CoFe or CoFeB and is deposited to a thickness of between about 15 Angstroms and about 75 Angstroms by sputtering. A capping layer 316 is deposited on the free magnetic layer 314 and may comprise nonmagnetic materials such as Hf, Ru, Ta, soft magnetic materials such as Ni or Ni containing alloys such as NiFe, or combinations thereof and have a thickness of between about 15 Angstroms and about 75 Angstroms. An insulating layer 318 is deposited on the sidewalls of the sensor 230A followed by a bias layer 320 that may be either a hard or soft magnetic material and may or may not have a capping layer 322 deposited thereover.

FIG. 3B shows a CPP-GMR read head 350 having a sensor 230B which is similar to the TMR sensor 230A of FIG. 3A, but instead of an oxide barrier layer for spacer layer 312, a conductive layer 330 is present instead. The conductive layer 330 may comprise a nonmagnetic material such as copper.

The embodiments discussed herein relate to an STO coupled to a circuit whereby both a DC and an AC signal can be applied across the STO. The DC current is biased across the STO to generate steady state oscillations of the free magnetic layer magnetization. The oscillations will then be injection locked to an externally applied AC current (with frequency chosen to be approximately twice the resonance frequency of the oscillator) by parametric excitation so that a combined signal with very low phase noise is generated. As the magnetic field acting on the STO sensor from the media varies, the resonant frequency of the oscillator would change in the absence of an external AC current, but in the embodiments discussed herein, which use parametric excitation from injection locking, the actual frequency of the oscillator remains unchanged in the injection locked state. Instead, the phase between the local oscillator and the STO must change as a function of the applied magnetic field. The phase differences are detected between the local oscillator and the STO signals using suitable detection electronics such as a RF mixer, as discussed below.

The injection locking method discussed herein offers several advantages. First, the locked STO signal at the resonant frequency $f_0$ is far in frequency from the injected signal $2f_0$. To understand the significance of the situation, consider that the STO output signal will contain components from both the STO as well as the external AC locking signal. If the STO is excited with an external AC signal with frequency at $f_0$, phase detection would be difficult without a RF component such as a circulator to separate out the individual STO and local oscillator signal components, which adds considerable complexity to the detection electronics. The systems discussed herein lock the AC signal and require a low or band pass filter attenuating signals at $2f_0$ to avoid such problems.

A second advantage is due to the fact that parametric excitation amplifies the signal at $f_0$ which will help with the overall sensor SNR. Finally, phase locking through parametric excitation increases the frequency range over which the external signal will lock to the STO and decreases the external signal power required for locking, which could relax some of the requirements for both the intrinsic STO properties and the detection electronics.

As discussed herein, parametric excitation is used to injection lock an external AC signal, $I_{rf}$, at $2f_0$ with an STO oscillating at $f_0$ by biasing the STO with a DC current, $I_c$. The state of the STO can be described as a dimensionless complex amplitude c(t) such that:

$$dc/dt + i\omega(p)c + \Gamma(I,p)c = VI_{ac0}e^{\wedge}(-i\omega_e t)c^*$$

where $p = |c^2|$ is the oscillator power, $\omega(p)$ is the power dependent auto-oscillator frequency of the STO, $I_{ac0}e^{\wedge}(-\omega_e t)$ is the AC current exciting the STO, $\omega_e$ is the excitation frequency, and V is a coupling term between the oscillator and AC current. The equation above allows a solution of the form:

$$c(t) = sqrt(p)e^{\wedge}(-i\omega_e t/2 + i\psi)$$

where $\psi$ is the oscillator's phase relative to the driving signal. This solution shows that to achieve resonance, the excitation frequency must be approximately twice the value of the STO's frequency to induce locking.

Implementing this into a drive would require implementing a circuit with a local oscillator, which could be an electronic oscillator, second STO, or similar element. At present, values for oscillator frequencies, $f_0$, in STOs can be designed to be between 5-7 GHz, meaning these local oscillators would require a frequency of between 10-14 GHz. The signal generated by this local oscillator would lock with the signal from the STO reader (at frequency $f_0$) oriented at the ABS and the locked signal would be amplified and then coupled into a phase detector (which could be a mixer or some other RF component) to determine the phase difference between the locked signal and some reference signal (which could be the same signal generated by the local oscillator, or a signal at $f_0$ driven by a separate local oscillator). As the media field interacts with the STO reader, the phase difference changes proportionately, providing a method for data read back.

Figure 4:
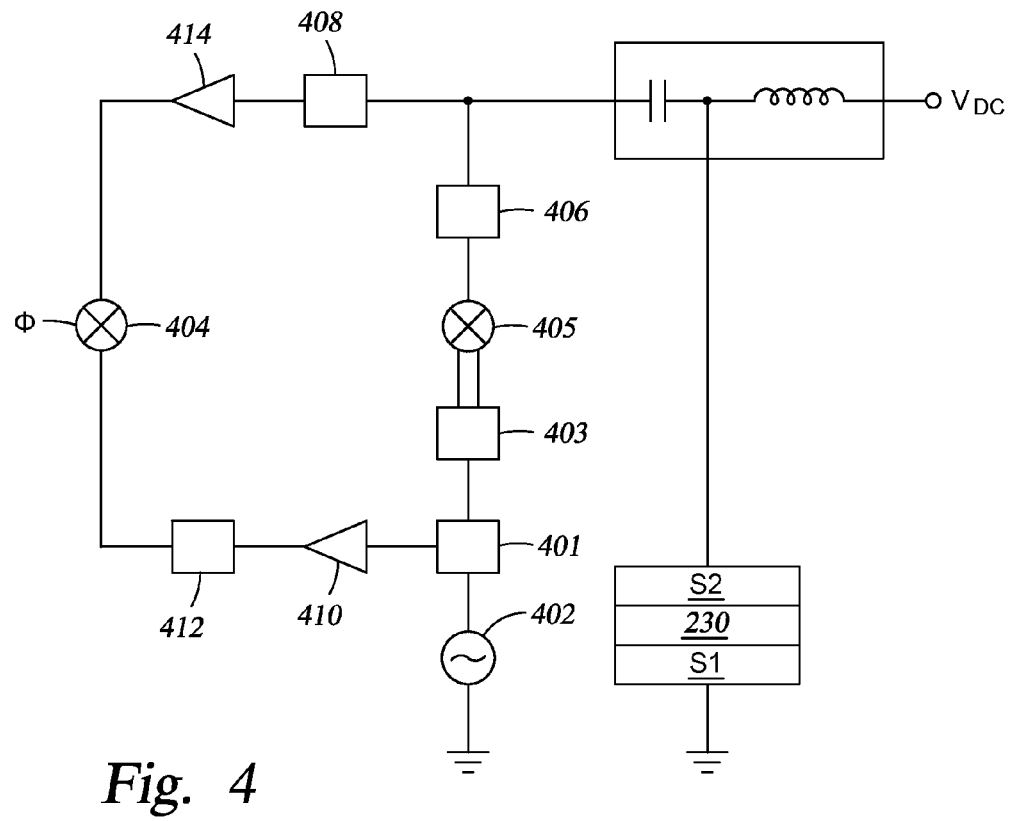
FIG. 4 is a schematic illustration of a read head coupled to an injection locking circuit according to one embodiment.

FIG. 4 is a schematic illustration of a read head coupled to an injection locking circuit according to one embodiment. The signal from the local oscillator 402 at $f_0$ is split using a power divider 401 or similar means, with part of the signal amplified by an amplifier 410 and sent through a time delay 412 and sent directly to one input of a mixer 404. Variable signal delay can be added to compensate for phase differences generated by differences in cable length. The other output of the power divider 401 will be split again with a second power divider 403 and then both outputs from the second power divider 403 are sent into another mixer 405 to generate a signal $2f_0$, which is isolated using a band pass filter 406 and used to injection lock with the STO detector. A second band pass filter 408 and amplifier 414 are inserted just before the second input of the detection mixer 404 which isolates the STO signal and still allows detection of the phase difference between the STO and original external AC signal.

Figure 5:
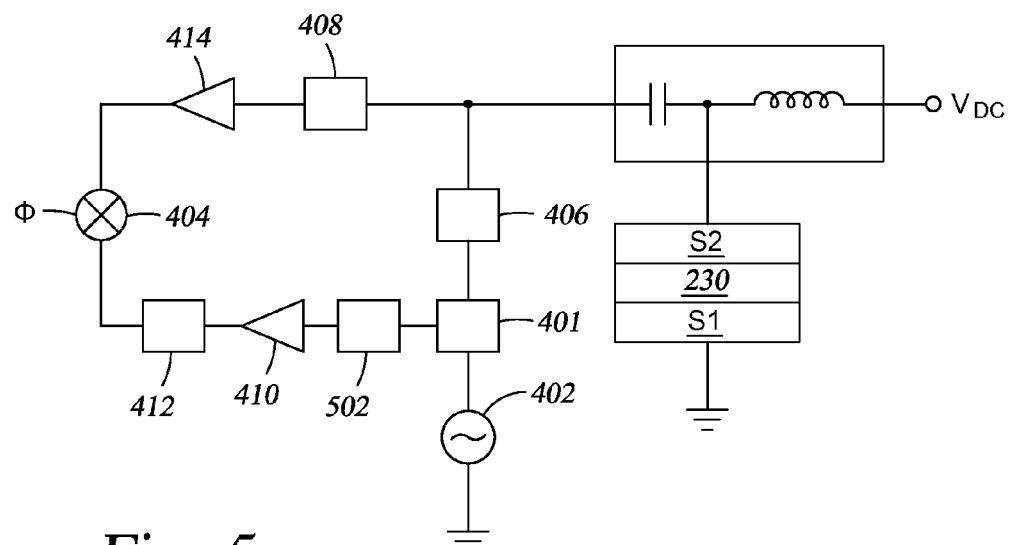
FIG. 5 is a schematic illustration of a read head coupled to an injection locking circuit according to another embodiment.

FIG. 5 is a schematic illustration of a read head coupled to an injection locking circuit according to another embodiment. The local oscillator 402 is a phase locked loop (PLL) that outputs a signal with a frequency $2f_0$. Here the signal from the local oscillator 402 at $2f_0$ is split using a power divider 401 or similar means with part of the signal sent through a frequency divider 502 used to step down the frequency to $f_0$ and then amplified by an amplifier 410 and sent through a time delay 412 and sent directly to one input of a mixer 404. The other output of the power divider 401 will be isolated using a band pass filter 406 and used to injection lock with the STO detector. A second band pass filter 408 and amplifier 414 are inserted just before the second input of the detection mixer 404 to isolate the STO signal and still allow detection of the phase difference between the STO and original external AC signal. This embodiment is useful for locking with higher harmonics ($f = nf_0$, $n = 3, 4, 5$, etc.) if desired as a PLL is an appropriate implementation to achieve higher harmonics.

By using parametric excitation to injection lock the STO to an external AC signal with a frequency that is at least two times the resonance frequency, the STO signal and readback SNR is improved.

While the foregoing is directed to exemplified embodiments, other and further embodiments of the invention may be devised without departing from the basic scope thereof, and the scope thereof is determined by the claims that follow.

What is claimed is:

1. A magnetic read head, comprising:
 a spin torque oscillator; and
 a circuit coupled to the spin torque oscillator such that the circuit uses parametric excitation to injection lock the spin torque oscillator, the circuit comprising:
  a local oscillator;
  a first power divider coupled to the local oscillator;
  a first amplifier coupled to the first power divider;
  a time delay coupled to the first amplifier;
  a first mixer coupled to the time delay;
  a second power divider coupled to the first power divider;
  a second mixer coupled to the second power divider;
  a first band pass filter coupled to the second mixer;
  a second band pass filter coupled to the first band pass filter; and
  a second amplifier coupled to the second band pass filter and the mixer.

2. The magnetic read head of claim 1, wherein the spin torque oscillator comprises a free magnetic layer and a pinned magnetic layer.

3. The magnetic read head of claim 2, wherein the spin torque oscillator comprises a nonmagnetic spacer layer between the pinned magnetic layer and the free magnetic layer.

4. The magnetic read head of claim 3, wherein the second power divider has two outputs and wherein both outputs of the second power divider couple to the second mixer.

5. The magnetic read head of claim 3, wherein a phase difference between the spin torque oscillator and an external AC signal from the local oscillator is measured at the first mixer.

6. The magnetic read head of claim 1, wherein the read head is a CPP-GMR spin torque oscillator.

7. The magnetic read head of claim 1, wherein the read head is a CPP-TMR spin torque oscillator.

8. The magnetic read head of claim 1, wherein the spin torque oscillator is locked to an external signal at frequencies that are higher harmonics of a resonance frequency of the spin torque oscillator.

9. The magnetic read head of claim 8, wherein the harmonics are $3f_0$ and higher.

10. The magnetic read head of claim 1, wherein the spin torque oscillator is injection locked to the local oscillator at about twice a resonant frequency of the spin torque oscillator.

11. The magnetic read head of claim 1, wherein a phase difference between the spin torque oscillator and an external AC signal from the local oscillator is measured at the first mixer.

12. A magnetic read head, comprising:
 a spin torque oscillator; and a circuit coupled to the spin torque oscillator such that the circuit uses parametric excitation to injection lock the spin torque oscillator, the circuit comprising:
- a local oscillator;
- a power divider coupled to the local oscillator;
- a frequency divider coupled to power divider;
- a first amplifier coupled to the frequency divider;
- a time delay coupled to the first amplifier;
- a mixer coupled to the time delay;
- a first band pass filter coupled to the power divider;
- a second band pass filter coupled to the first band pass filter; and
- a second amplifier coupled to the second band pass filter and the mixer.

13. The magnetic read head of claim 12, wherein the spin torque oscillator comprises a free magnetic layer and a pinned magnetic layer.

14. The magnetic read head of claim 13, wherein the spin torque oscillator comprises a nonmagnetic spacer layer between the pinned magnetic layer and the free magnetic layer.

15. The magnetic read head of claim 14, wherein the spin torque oscillator is injection locked to the local oscillator at about twice a resonant frequency of the spin torque oscillator.

16. The magnetic read head of claim 14, wherein a phase difference between the spin torque oscillator and an external AC signal from the local oscillator is measured at the mixer.

17. The magnetic read head of claim 12, wherein the read head is a CPP-GMR spin torque oscillator.

18. The magnetic read head of claim 12, wherein the read head is a CPP-TMR spin torque oscillator.

19. The magnetic read head of claim 12, wherein the spin torque oscillator is locked to an external signal at frequencies that are higher harmonics of a resonance frequency of the spin torque oscillator.

20. The magnetic read head of claim 19, wherein the harmonics are $3f_0$ and higher.

21. The magnetic read head of claim 12, wherein the spin torque oscillator is injection locked to the local oscillator at about twice a resonant frequency of the spin torque oscillator.

22. The magnetic read head of claim 12, wherein a phase difference between the spin torque oscillator and an external AC signal from the local oscillator is measured at the mixer.

* * * * *